United States Patent
Slone et al.

(10) Patent No.: US 7,265,993 B1
(45) Date of Patent: Sep. 4, 2007

(54) DISPERSIVE INTERCONNECT SYSTEM FOR EMI REDUCTION

(75) Inventors: Rodney D. Slone, Redwood City, CA (US); David M. Hockanson, Boulder Creek, CA (US); Charlotte E. Stoutamire, Redwood City, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 136 days.

(21) Appl. No.: 11/129,886

(22) Filed: May 16, 2005

(51) Int. Cl.
*H05K 7/00* (2006.01)
(52) U.S. Cl. .................................... 361/760
(58) Field of Classification Search ............. 361/760, 361/818, 816, 800, 802, 709, 711; 174/35.51, 174/250, 258, 262
See application file for complete search history.

(56) References Cited

U.S. PATENT DOCUMENTS

| | | | |
|---|---|---|---|
| 4,557,225 A * | 12/1985 | Sagues et al. | 123/41.31 |
| 6,532,439 B2 | 3/2003 | Anderson | |
| 6,571,184 B2 | 5/2003 | Anderson | |
| 6,573,590 B1 * | 6/2003 | Radu et al. | 257/660 |
| 6,597,575 B1 * | 7/2003 | Matayabas et al. | 361/705 |
| 6,789,241 B2 | 9/2004 | Anderson | |
| 6,850,828 B2 | 2/2005 | Chen | |
| 6,944,025 B2 | 9/2005 | Hockanson | |
| 6,956,285 B2 * | 10/2005 | Radu et al. | 257/697 |
| 2004/0062020 A1 | 4/2004 | Leung | |
| 2005/0029482 A1 | 2/2005 | Johnson et al. | |
| 2005/0062154 A1 * | 3/2005 | Duchesne et al. | 257/738 |

* cited by examiner

*Primary Examiner*—Dean A. Reichard
*Assistant Examiner*—Abiy Getachew
(74) *Attorney, Agent, or Firm*—Meyertons Hood Kivlin Kowert & Goetzel, P.C.; B. Noël Kivlin; Chris D. Thompson

(57) ABSTRACT

An interconnect system between an integrated circuit device and a printed circuit board may include a filter portion coupled to conductors on a power distribution bus. The filter portion may reduce radiated emissions produced during operation of the integrated circuit. The interconnect may include dispersive elements. The dispersive elements may be less electrically conductive of current in a higher frequency range than in a lower frequency range. In some embodiments, the second level interconnect may include a socket having dispersive contacts. The contacts may be coupled to core power conductors on the power distribution bus.

22 Claims, 4 Drawing Sheets

DISPERSIVE INTERCONNECT SYSTEM FOR EMI REDUCTION

BACKGROUND OF THE INVENTION

1. Field of the Invention

This invention relates generally to electronic equipment, such as computers, and, more particularly, to apparatus and methods for reducing electromagnetic interference caused by integrated circuit devices.

2. Background Information

Many electronic devices such as integrated circuits generate undesirable amounts of electromagnetic interference (EMI) during operation. For example, processors mounted on printed circuit boards (PCBs) may cause electromagnetic radiated emissions by injecting high frequency current into the printed circuit board, which then couples, directly or indirectly, to neighboring integrated circuits and other components. Such coupling may interfere with the individual performance of the devices, and thus adversely affect the overall performance of the system. In addition, because of the negative effects of EMI, the level of acceptable radiated emissions is subject to strict regulatory limits. For these reasons, it is desirable to contain or suppress the EMI generated by an integrated circuit.

There are two major methods by which integrated circuits can produce radiation: heatsink coupling and power bus injection. Various components have been employed to mitigate one or both of these EMI coupling mechanisms in a system. Some solutions involve grounding a lid or heatsink on the component and/or building a Faraday cage around the EMI producing chip (e.g., a CPU). In addition, various components such as gaskets, skirts, panels, and doors may be included in a system to contain emissions. Such components represent an additional cost and potential point of failure, as they typically require a separate part that must be added to the printed circuit board or enclosure.

In some processors, the second harmonic may be a significant contributor to EMI. The EMI effects may be a result of high-frequency current generated by complementary metal-oxide semiconductor (CMOS) devices in the integrated circuit. As integrated circuit technology advances, processors operate at increased frequency and power, thus presenting even greater challenges in maintaining emissions within acceptable levels.

SUMMARY OF THE INVENTION

Various embodiments of computer systems and apparatus and methods for connecting integrated circuit devices to circuit boards are disclosed. In an embodiment, a system may include a printed circuit board and an integrated circuit. The integrated circuit may be coupled to a power subsystem through a power distribution bus. An interconnect between the integrated circuit device and the printed circuit board may include a filter portion coupled to conductors in the power distribution bus. The filter portion may reduce radiated emissions produced during operation of the integrated circuit device while not affecting the delivery of low frequency current to power the integrated circuit device.

In some embodiments, a second level interconnect between an integrated circuit device and a printed circuit board may include dispersive elements. The dispersive elements may be less electrically conductive of current in a higher frequency range than in a lower frequency range. The dispersive elements may be coupled to conductors in the power distribution bus. The dispersive elements may reduce radiated emissions from the integrated circuit (e.g., emissions caused by switching of transistors in the integrated circuit at high frequencies) by restricting the high frequency current to the interior of the integrated circuit so that those currents are not permitted to exit the integrated circuit. In another embodiment, dispersive elements may be provided at a first level interconnect between a chip and substrate of an integrated circuit device.

In some embodiments, dispersive elements at a second level interconnect may be less conductive in a selected frequency range. In some embodiments, dispersive elements may be less conductive above a selected cutoff frequency. In certain embodiments, dispersive elements at a second level interconnect may reduce radiated emissions at the second harmonic of the operating frequency of an integrated circuit. In one embodiment, the integrated circuit is a central processing unit.

In some embodiments, a second level interconnect may include a socket having dispersive contacts. In one embodiment, the dispersive contacts include a material having a lower conductivity at high frequencies than at low frequencies. In certain embodiments, the dispersive contacts may include a conductive core with coating that is less conductive than the core in a frequency range of interest.

In one embodiment, dispersive elements at a second level interconnect are provided for core power conductors. In other embodiments, dispersive elements are provided for I/O power conductors, I/O signal conductors, or ground conductors. In some embodiments, the dispersive elements are provided for power supply voltage conductors. In one embodiment, dispersive elements are provided for power supply voltage conductors and non-dispersive elements are provided for ground conductors.

In an embodiment, a method for reducing EMI in a computer system may include providing a filter portion at a second level interconnect between an integrated circuit device and a printed circuit board. The filter portion may filter current in at least some of the conductors in a power distribution bus coupled to the integrated circuit. In some embodiments, the filter portion may include dispersive elements. In one embodiment, non-dispersive (e.g., conventional metal) contacts in a standard socket are replaced with dispersive contacts at selected locations in an array of contacts.

In an embodiment, a socket may include an interposer and an array of columns coupled to the interposer. The columns may include a combination of dispersive and non-dispersive elements. In one embodiment, the columns on the socket may couple with a ball grid array on an integrated circuit device. In another embodiment, the columns on the socket may couple with pads of a land grid array on an integrated circuit device.

BRIEF DESCRIPTION OF THE DRAWINGS

Other aspects of the invention will become apparent upon reading the following detailed description and upon referring to the accompanying drawings in which.

Figures 1, 2:
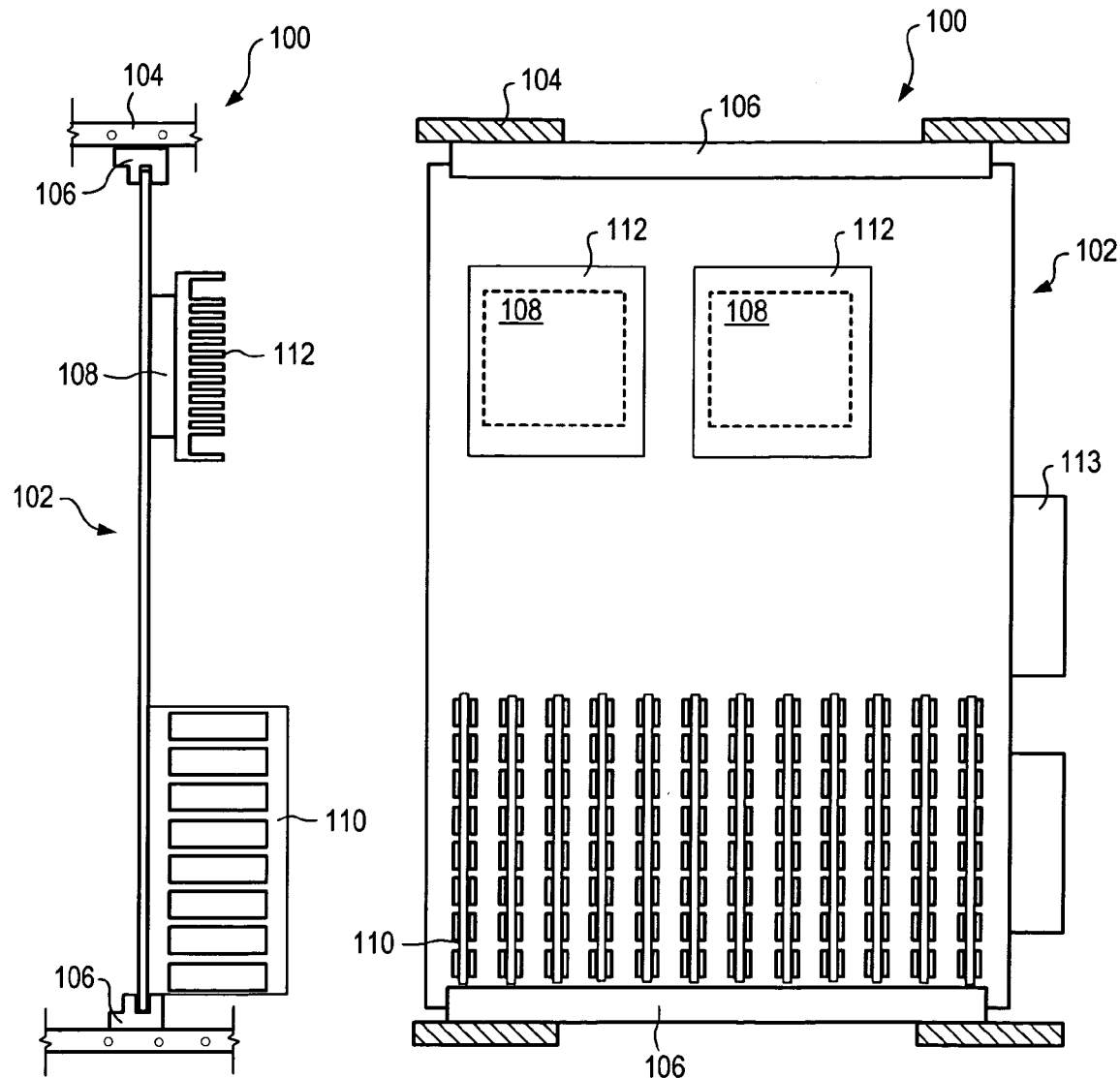
FIG. 1 is a front view of a circuit module including processors and memory modules.
FIG. 2 is a side view of a circuit module including processors and memory modules.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

The following description generally relates to apparatus and methods for reducing EMI in computer systems. Such systems and methods may be used in a variety of applications. A non-exhaustive list of such applications includes: telecommunications network server systems; e-commerce web server systems; LAN application and file server systems; personal computer systems; and remote vehicle control systems.

As used herein, "module" includes any modular unit or subsystem. Examples of a module include, but are not limited to, a printed circuit board assembly, an information-processing cartridge, a memory module, a power supply, or a combination thereof. In certain embodiments, a module may include multiple circuit boards (e.g., a mezzanine card mounted to a main circuit board). In certain embodiments, components of a module may be housed in an enclosure.

As used herein, "circuit module" includes any module that includes or carries elements of an electrical circuit, electrical components (including, but not limited to, semiconductor devices, resistors, capacitors, relays, switches, and connectors), or conductors (e.g., wires, traces). As used herein, "circuit board" includes any circuit module that carries one or more other circuit modules or components. "Circuit board" includes, but is not limited to, a printed circuit board made of epoxy-glass and metal layers. As used herein, "component" includes any element of system, including, but not limited to, a printed circuit board, a semiconductor device, a resistor, a capacitor, a power supply, or a disk drive.

As used herein, "enclosure" includes any structure that supports or houses one or more elements of a computer system (e.g., electronic modules). A module may be supported in an enclosure by various structures including, but not limited to, slides, rails, a shelf, or a bottom or wall of an enclosure.

FIGS. 1 and 2 depict a portion of computer system 100 including circuit module 102. Circuit module 102 may be installed in enclosure 104 on rails 106. Circuit module 102 may include one or more processors 108 and one or more memory modules 110. Heat sinks 112 may be coupled to processors 108 to promote conduction of heat from processors 108. Circuit module 102 may include connectors 113 for electrical connections with various external components of the system.

Figure 3:
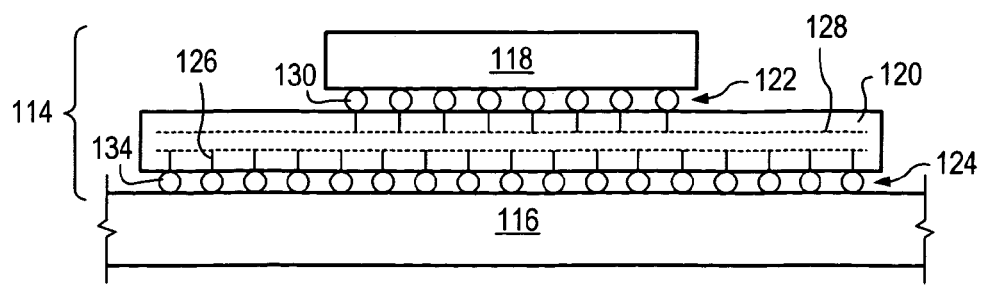
FIG. 3 is a side view of an integrated circuit device installed on a printed circuit board.

FIG. 3 depicts a side view of integrated circuit (IC) device 114 mounted on printed circuit board 116. An integrated circuit, as used herein, may be, but is not limited to, a processor such as a central processing unit(s), an application specific integrated circuit (ASIC), or a memory chip. In some embodiments, an integrated circuit may include CMOS devices.

Integrated circuit device 114 may include a core that performs the primary function of the integrated circuit. The functions performed by the core may be that of a microprocessor, a digital signal processor, an interface chip (e.g., a chip to interface a processor to a peripheral bus), a peripheral controller, a floating point gate array (FPGA), or whatever other functions that an integrated circuit device is designed to perform, as desired. Integrated circuit device 114 may also include input/output (I/O) cells coupled to the core. The I/O cells may provide an interface between core and other circuitry external to integrated circuit device 114. For example, the I/O cells may transmit signals generated within the core to external devices, or may receive and convey externally generated signals to the core. In some embodiments, the I/O cells are located on the same silicon die as the core. In other embodiments, the I/O cells are on a separate silicon die from the core.

As used herein, "core power" generally refers to power that is distributed to the core of the silicon chip in the package. As used herein, "I/O power" generally refers to power that is distributed to I/O cells coupled to the core. In some embodiments, the core power may have different voltage requirements than any I/O cells that provide an interface between external devices and the core logic of the silicon chip. In such embodiments, the core power and the I/O power may be distributed separately from each other. In other embodiments, the core power and the I/O cell power may have the same voltage requirements, and thus core power and I/O cell power may be distributed together (i.e., through the same connections).

Integrated circuit device 114 may include chip 118. Chip 118 may be coupled to a top surface of substrate 120. First level interconnect 122 may be provided between chip 118 and substrate 120. Second level interconnect 124 may be provided between substrate 120 and printed circuit board 116.

Substrate 120 may include vias 126 and horizontal layers 128. Vias 126 and horizontal layers 128 may electrically connect contacts at first level interconnect 122 with corresponding contacts at second level interconnect 124. Horizontal layers 128 may include power planes, ground planes and signal layers. In one embodiment, vias 126 are plated through holes. It will be understood, however, that vias 126 may include any conductive elements that provide electrical connections through all or part of substrate 120.

A first level interconnect may include any of various elements for providing an electrically conductive path between a chip and a substrate. Examples of elements for first level interconnects include, but are not limited to, an array of solder bumps or pads.

In certain embodiments, a first level interconnect may be a flip chip connection. As shown in FIG. 3, first level interconnect 122 may include conductive bumps 130. Chip underfill may fill gaps between chip 118 and substrate 120 in the area of conductive bumps 130.

A second level interconnect may include any of various elements for providing an electrically conductive path between a substrate of an integrated circuit device and a printed circuit board. Examples of such elements include, but are not limited to, pins, pads, sleeves, sockets, solder balls, bumps, columns, pillars, spring contacts, or a combination thereof. Examples of second level interconnect arrangements include, but are not limited to, area arrays such as pin grid arrays (PGA), micro pin grid arrays (μPGA), ball grid arrays (BGA), micro ball grid arrays (μBGA), or land grid arrays (LGA). Other examples of arrangements for second level interconnects include peripherally leaded packages, such as quad flat packs or plastic leaded chip carriers. In some embodiments, an integrated circuit device may be received in a socket (e.g., a zero-insertion force (ZIF) socket) on the printed circuit board. In other embodiments, an integrated circuit device may be directly coupled to a printed circuit board (e.g., soldered into plated through-holes on the printed circuit board). As shown in FIG. 3, second level interconnect 124 may include an array of solder balls 134. Second level interconnect 124 may include connections for power, signal, and ground.

In some embodiments, a power distribution bus for an integrated circuit may include a filter portion. As used herein, a "filter portion" generally refers to an electrically conductive element or combination of electrically conductive elements that reduce current flowing in a conductive path in a frequency range of interest. The filter portion may be selected to reduce EMI injected by the integrated circuit onto the power distribution bus. For example, the filter portion may filter out high frequency processor noise before it can be injected into a printed circuit board and radiate from the system. In certain embodiments, the filter portion may be part of a second level interconnect between the integrated circuit device and a printed circuit board.

Signal or power integrity in a system may be compromised if low frequency current to integrated circuits (e.g., current from a power supply) is filtered to an excessive degree. A filter portion in an interconnect may be selected to filter current at high frequencies in order to reduce noise, but to allow current at lower frequencies to pass with little or no attenuation. Thus, EMI reduction may be achieved while maintaining the power and signal integrity of the system.

In some embodiments, a filter portion may include dispersive elements. The dispersive elements may be completely or partially made of a dispersive material. As used herein, a "dispersive material" generally refers to a material or combination of materials whose electrical conductivity varies as a function of frequency. As a specific example, a dispersive material may filter current above 500 MHz, but not filter current below 500 MHz. As another example, a dispersive material may filter current above 100 MHz, but not filter current below 100 MHz. Dispersive elements may have various forms, including, but not limited to, columns, pins, sleeves, leads, bumps, or pads, or as coatings or platings over such elements.

In some embodiments, dispersive elements may be provided at a second level interconnect of an integrated circuit. In other embodiments, dispersive elements may be provided at a first level interconnect of an integrated circuit. Dispersive elements may be selected to reduce radiated emissions caused by switching transistors in the integrated circuit by a desired amount. A dispersive element may be selected to have a relatively high conductivity at low frequencies (e.g., below 500 MHz), and a relatively low conductivity at high frequencies (e.g., above 500 MHz). Thus, dispersive elements may reduce radiated emissions caused by high-frequency switching in the integrated circuit, while maintaining performance of the system at lower frequencies. In one embodiment, the dispersive elements are selected to reduce noise at a particular harmonic of an integrated circuit, such as the second harmonic.

Figure 4:
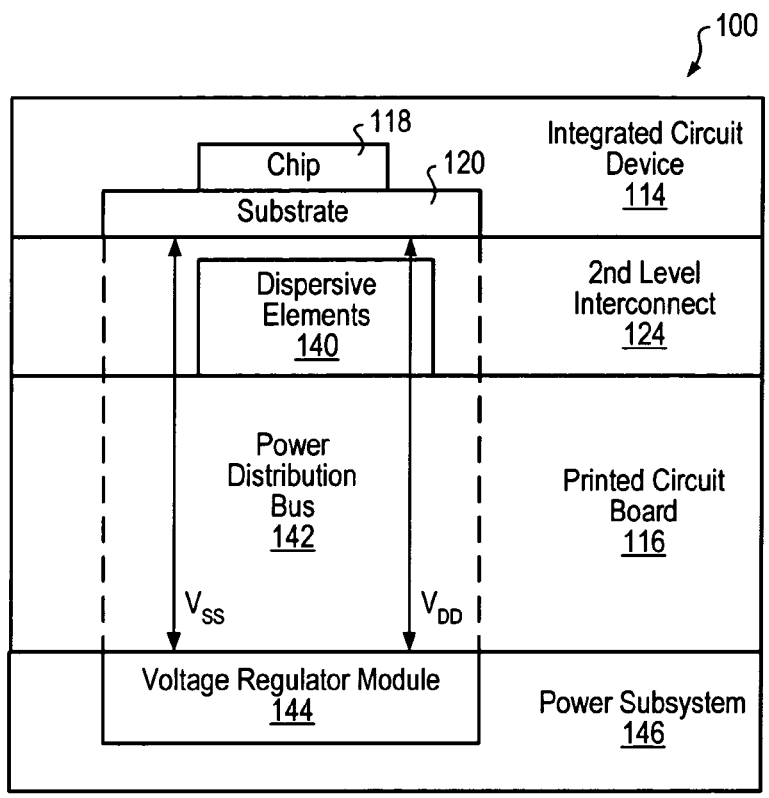
FIG. 4 is a block diagram of a system for reducing EMI including dispersive elements for power supply voltage ($V_{dd}$) conductors.

FIG. 4 depicts a block diagram of computer system 100 including dispersive elements 140 at second level interconnect 124 of integrated circuit device 114. Integrated circuit device 114 is coupled to printed circuit board 116 at second level interconnect 124. Computer system 100 may include power distribution bus 142. Power distribution bus 142 may connect integrated circuit device 114 with voltage regulator module 144 in power subsystem 146. As used herein, "bus" generally refers to one or more conductors that are used for the transmission of signals, data, or power from one or more sources to one or more destinations. A line of a bus may be a single conductive element, such as a metallized region on a circuit board, or a combination of conductive elements connected to one another. As used herein, "power subsystem" generally refers to any combination of components that supply or regulate electrical power. In some embodiments, integrated circuit device 114 and voltage regulator module 144 may be included on the same module. In other embodiments, integrated circuit device 114 and voltage regulator module 144 may be provided on separate modules.

Figure 5:
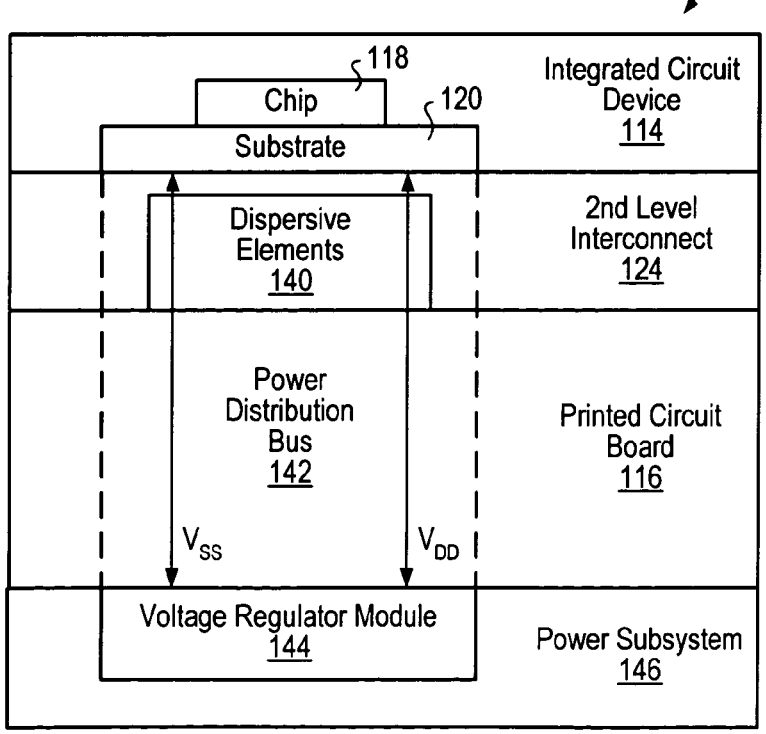
FIG. 5 depicts a block diagram of system including dispersive elements for power supply voltage ($V_{dd}$) conductors and ground ($V_{ss}$) conductors.

Dispersive elements 140 may be provided for one or more conductors on the power distribution bus 142. In some embodiments, as shown in FIG. 4, dispersive elements 140 are included for one or more power supply voltage ($V_{dd}$) conductors, while non-dispersive elements are provided for the ground ($V_{dd}$) conductors. Providing dispersive elements for power supply voltage conductors and non-dispersive elements for ground conductors may advantageously reduce EMI while maintaining a ground reference at higher frequencies. It will be understood, however, that in other embodiments, dispersive elements may be included for ground ($V_{ss}$) conductors only, or for a combination of power supply voltage ($V_{dd}$) conductors and ground ($V_{ss}$) conductors. FIG. 5 depicts a block diagram of computer system 100 including dispersive elements for both power supply voltage ($V_{dd}$) conductors and ground ($V_{ss}$) conductors.

In some embodiments, dispersive elements may be included for core power conductors, but not for I/O power conductors. In another embodiment, dispersive elements may be included for I/O power conductors, but not for core power conductors. In still another embodiment, dispersive elements may be included for a combination of core power conductors and I/O power conductors. In certain embodiments, dispersive elements may be included for I/O signal conductors.

Various materials and processes may be used to produce dispersive elements. In some embodiments, dispersive elements may be formed by modifying elements made of conventional conductors, such as silver or nickel. For example, a dispersive element may include an outer coating layer that is applied to a metal core. The coating material may have a lower conductivity than the core material. Alternatively, the dispersive element may be made of a solid frequency-sensitive material whose bulk conductivity changes as a function of frequency.

Suitable dispersive materials may include, but are not limited to, silver sulfide on silver particles, (which may be subsequently embedded in an elastomer base); silver flakes; or silver particles coated with nickel or another less conductive metal and embedded in an elastomer base. Another suitable dispersive material system may include a molybdenum or copper base metal with a less conductive metallic or carbonaceous coating. Yet another suitable material may include a metallic glass with desirable electrically conductive properties. It will be understood that other materials and arrangements may be used in dispersive elements to achieve a desired level of EMI reduction.

The EMI damping capabilities of a system may vary with the thickness of any coating. For example, a suitable thickness of a silver sulfide coating may be between about 0.5 microns and about 1.0 micron.

In some embodiments, a second level interconnect system for an integrated circuit device may include a socket having dispersive contacts. As used herein, "contact" generally refers to any conductive part that acts with another conductive part to make or break a circuit. Contacts may have various forms and shapes, including, but not limited to, a column, a rod, a plug, a bar, a hollow sleeve, a spring, or a tab.

Figure 6:
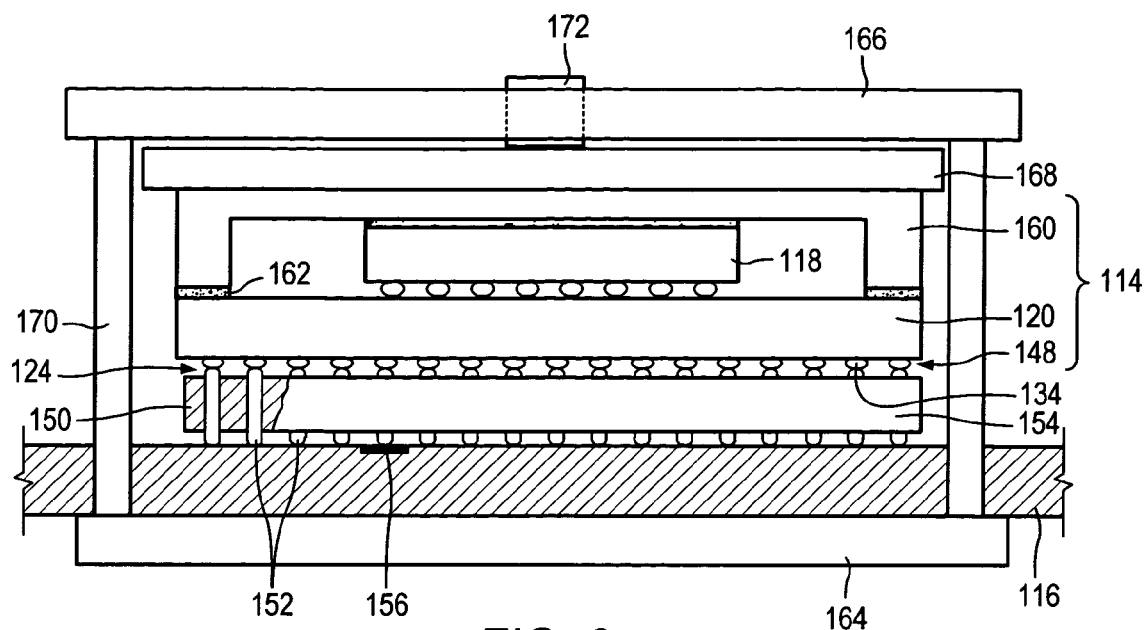
FIG. 6 is a side view of an integrated circuit device including a ball grid array mounted on a socket on a printed circuit board.

FIG. 6 depicts an integrated circuit device 114 mounted on printed circuit board 116. Integrated circuit device 114 may include chip 118 coupled on substrate 120. Substrate 120 may include ball grid array 148 formed of solder balls 134.

Second level interconnect 124 may include socket 150. In some embodiments, as shown in FIG. 6, a socket may be a separate element that is interposed between the integrated circuit and the printed circuit board. In other embodiments, a socket may be attached to or integrated with a printed circuit board assembly (e.g., a zero insertion force socket). Socket 150 may include contacts 152 and interposer 154. Interposer 154 may support and align contacts 152. Interposer 154 may be made of a dielectric material, such as plastic or ceramic. In one embodiment, as shown in FIG. 6, contacts 152 are cylindrical columns. In other embodiments, contacts 152 may have various other forms, such as fuzz buttons or springs. Contacts 152 may extend between solder balls 134 on integrated circuit device 114 and pads 156 on printed circuit board 116.

Contacts 152 at some locations in the array may be dispersive contacts. Contacts 152 at other locations in the array may be made of conventional conductive materials. In one embodiment, dispersive contacts are provided for one or more of the power supply voltage connections, and non-dispersive contacts are provided for the other connections between integrated circuit device 114 and printed circuit board 116. In certain embodiments, a socket may be produced by modifying a standard socket to replace non-dispersive contacts with dispersive contacts at selected locations in the power distribution portion of the socket.

Lid 160 may be installed on chip 118. Lid 160 may be coupled to chip 118 and substrate 120 using adhesive 162. Lid 160 may help contain EMI within integrated circuit device 114. In certain embodiments, sides of lid 160 may extend downward to printed circuit board 116 to reduce emissions from substrate 120. Other arrangements for reducing emissions from substrate 120 may include a gasket around the substrate, metallization on external sides of the substrate, and/or ground pins disposed along a periphery of the substrate. Bolster plate 164 may be provided on the side of printed circuit board 116 opposite integrated circuit device 114. Spring plate 166 and compression plate 168 may be provided on top of integrated circuit device 114. Spring plate 166 may be coupled to posts 170 on bolster plate 164.

Load screw 172 may threadably engage spring plate 166 near the center of spring plate 166. When load screw 172 is actuated, compression plate 168 may bear against lid 160 of integrated circuit device 114. Contacts 152 may be compressed between solder balls 134 of integrated circuit device 114 and corresponding pads 156 on printed circuit board 116. Compression of contacts 152 between integrated circuit device 114 and printed circuit board 116 may establish a reliable electrical connection between solder balls 134 and pads 156.

Figure 7:
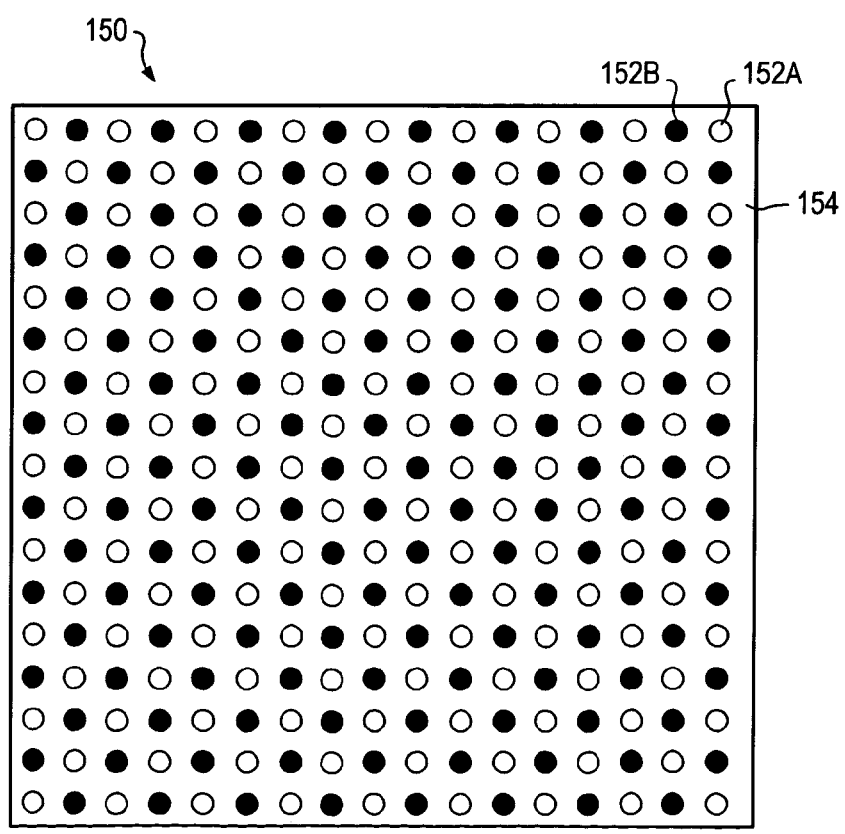
FIG. 7 is a schematic diagram of a socket including dispersive and non-dispersive contacts.

FIG. 7 depicts a schematic diagram of socket 150 having contacts 152 arrayed in interposer 154. Power supply voltage ($V_{dd}$) may be provided through contacts 152A, and ground ($V_{ss}$) may be provided through contacts 152B. In one embodiment, all of the power supply voltage ($V_{dd}$) contacts are dispersive contacts and all of the ground ($V_{ss}$) contacts are non-dispersive contacts. It will be understood that some of the contacts provided on socket 150 may be allocated for signals and other power and ground lines.

Figure 8:
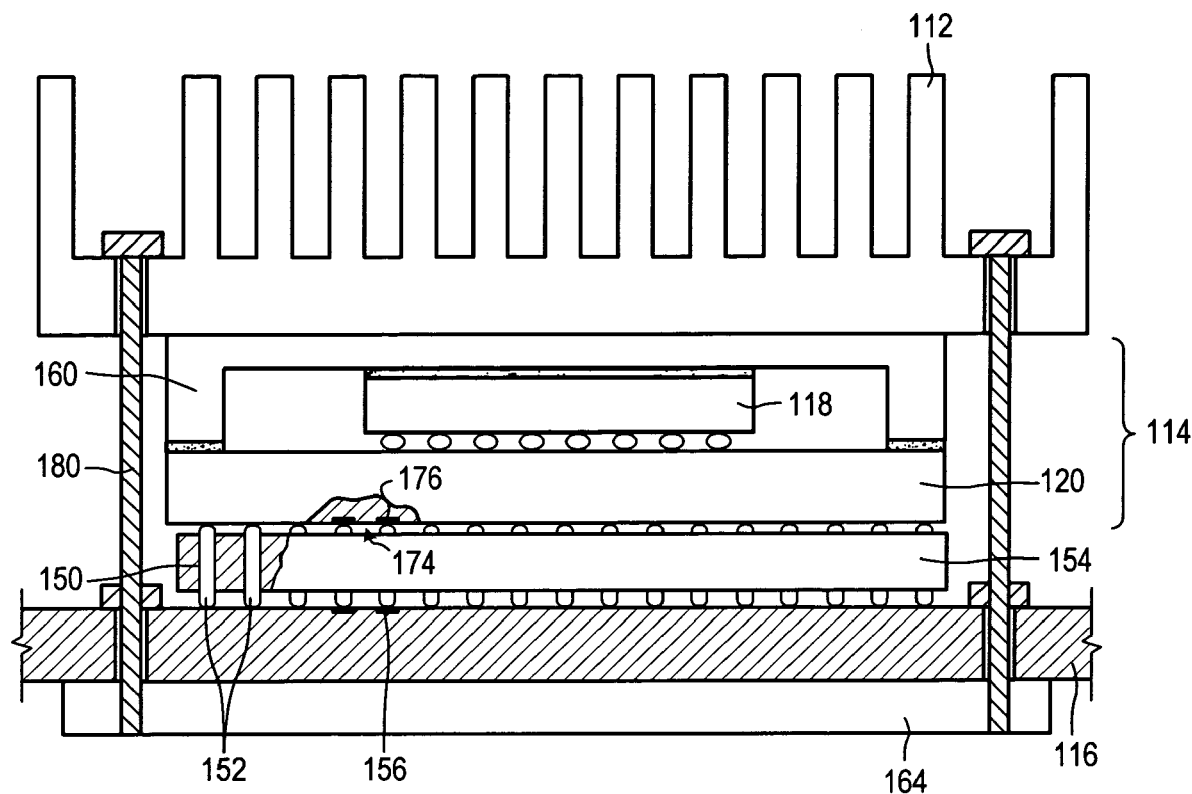
FIG. 8 is a side view of an integrated circuit device including a land grid array mounted on a socket on a printed circuit board.

FIG. 8 depicts integrated circuit device 114 including land grid array 174. A combination of dispersive contacts and non-dispersive contacts may be provided on interposer 154 between pads 176 on integrated circuit device 114 and corresponding pads 156 on printed circuit board 116. Heat sink 112 may be mounted on lid 160 and coupled to fasteners 180 extending from bolster plate 164. Contacts 152 may be compressed between integrated circuit device 114 and printed circuit board 116 when fasteners 180 are actuated to couple heat sink 112 to lid 160.

Figure 9:
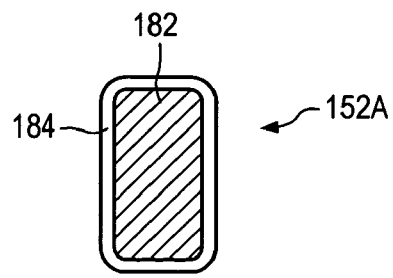
FIG. 9 is a detailed view of a socket column including a dispersive coating.

FIG. 9 depicts a cross sectional view of dispersive contact 152A. Dispersive contact 152A may include core 182 and coating 184. In some embodiments, coating 184 may be on only a portion of the outer surface of core 182 (e.g., a top surface only, a bottom surface only). While the dispersive elements in FIGS. 6, 8, and 9 are depicted as socket contacts, it will be understood that dispersive elements may come in other forms. For example, a dispersive element may be a discrete element that is separate from a socket contact (e.g., an insert or plug). As another example, dispersive elements may be provided as coating or plating on pins, sleeves, or pads on the integrated circuit or printed circuit board. In one embodiment, a dispersive element is brazed or soldered onto a pad of an integrated circuit device or a printed circuit board. In other embodiments, core 182 may have a bulk conductivity that is dispersive.

As used herein, "coupled" includes a direct coupling or an indirect coupling (e.g., with one or more intervening elements) unless expressly stated otherwise. For example, an integrated circuit device may be coupled to a printed circuit board by directly attaching the integrated circuit device to the printed circuit board, or by mounting the integrated circuit device on a socket attached to the printed circuit board.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims. For example, when the terms "front," "rear," "vertical," "horizontal," "upward," "downward," "under," "over," "left," or "right" are used in the claims, they are to be understood to relate to the Figures as illustrated. However, the device may be turned at an angle to the horizontal or inverted with the quoted terms referring to the altered orientation.

What is claimed is:

1. A system, comprising:
   a printed circuit board;
   an integrated circuit device comprising a chip and a substrate, the chip being coupled to the substrate at a first level interconnect, the substrate being coupled to the printed circuit board at a second level interconnect;
a power subsystem;
a power distribution bus connecting the power subsystem to the integrated circuit device; and
a filter portion comprising two or more dispersive contacts in at least one of the first or second level interconnects, each of the dispersive contacts being less electrically conductive in a first frequency range than in a second frequency range, the first frequency range being higher than the second frequency range, such that alternating current flowing through the dispersive contact between the integrated circuit device and the printed circuit board is reduced in the first frequency range relative to the second frequency range, wherein the filter portion is configured to reduce radiated emissions produced during operation of the integrated circuit by reducing current injected into the printed circuit board through the dispersive contacts in the first frequency range.

2. The system of claim 1, wherein the second level interconnect comprises a socket, wherein at least a portion of each of the dispersive contacts resides in the socket, wherein the current through the dispersive contact varies as a function a frequency.

3. The system of claim 1, wherein at least one of the dispersive contacts comprises a core that has a dispersive bulk conductivity, wherein dispersive bulk conductivity of the core varies as a function a frequency.

4. The system of claim 1, wherein at least one of the dispersive contacts comprises a conductive core with a coating on the core of the contact, wherein the coating comprising a material that is less electrically conductive than the conductive core, wherein the current through the at least one contact varies as a function a frequency.

5. The system of claim 1, wherein the dispersive elements are coupled to a plurality of core power conductors on the power distribution bus.

6. The system of claim 1, wherein the dispersive elements are coupled to a plurality of power supply voltage conductors on the power distribution bus.

7. The system of claim 1, wherein the dispersive elements are coupled to a plurality of ground conductors.

8. The system of claim 1, wherein the dispersive elements are coupled to a plurality of I/O signal conductors.

9. The system of claim 1, wherein the second level interconnect comprises a plurality of dispersive contacts and a plurality of non-dispersive contacts, wherein the power distribution bus comprises a plurality of power supply voltage conductors and a plurality of ground conductors, wherein the plurality of dispersive contacts are coupled to the plurality of power supply voltage conductors, wherein the plurality of non-dispersive contacts are coupled to the plurality of ground conductors.

10. The system of claim 1, wherein the integrated circuit device comprises a central processing unit.

11. An interconnect system for an integrated circuit, comprising a plurality of contacts, each of the plurality of contacts configured to electrically couple a conductor in the integrated circuit to a conductor in a printed circuit board, at least one of the plurality of contacts being less electrically conductive of an alternating current in a first frequency range than in a second frequency range, the first frequency range being higher than the second frequency range, such that alternating current flowing through the at least one contact between a conductor in the integrated device and a conductor in the printed circuit board is reduced in the first frequency range relative to the second frequency range.

12. The interconnect system of claim 11, wherein at least one of the plurality of contacts comprises a material having an electrical conductivity that is lower in the first frequency range than in the second frequency range.

13. The interconnect system of claim 11, wherein at least one contact comprises a core and a coating on at least a portion of the core, wherein an electrical conductivity of the coating is less than an electrical conductivity of the body, wherein the contact is configured to allow current to pass through the core and the coating on the core during operation, wherein the current varies as a function of frequency.

14. The interconnect system of claim 11, wherein the first frequency range comprises a range of frequencies above about 500 MHz, wherein the second frequency range comprises a range of frequencies below about 500 MHz.

15. The interconnect system of claim 11, further comprising a socket, wherein the socket comprises an interposer, wherein the contacts comprise columns coupled to the interposer.

16. The interconnect system of claim 11, wherein the plurality of contacts are at a second level interconnect, wherein the second level interconnect couples a substrate for the integrated circuit to the printed circuit board.

17. The interconnect system of claim 11, wherein the plurality of contacts are configured to filter current at high frequencies to reduce noise, but to allow current at lower frequencies to pass through the plurality of contacts substantially without being filtered.

18. The interconnect system of claim 11, wherein the plurality of contacts are configured to filter current at a predetermined harmonic of the integrated circuit.

19. The interconnect system of claim 11, wherein the plurality of contacts are configured to filter current at a second harmonic of the integrated circuit.

20. The system of claim 1, wherein the two or more contacts are configured to filter current at high frequencies to reduce noise, but to allow current at lower frequencies to pass through the plurality of contacts substantially without being filtered.

21. The system of claim 1, wherein the power distribution bus connects the integrated circuit to the power subsystem, wherein the filter portion is configured to filter current in at least some of the conductors in the power distribution bus, wherein the filter portion is configured to reduce radiated emissions produced during operation of the integrated circuit.

22. A system, comprising:
a printed circuit board;
an integrated circuit device comprising a chip and a substrate, the chip being coupled to the substrate at a first level interconnect, the substrate being coupled to the printed circuit board at a second level interconnect; and
a filter portion comprising two or more dispersive contacts at the second level interconnect, each of the dispersive contacts being less electrically conductive in a first frequency range than in a second frequency range, the first frequency range being higher than the second frequency range, such that alternating current flowing through the dispersive contact between the integrated circuit device and the printed circuit board is reduced in the first frequency range relative to the second frequency range, wherein the filter portion is configured to reduce radiated emissions produced during operation of the integrated circuit by reducing current injected into the printed circuit board through the dispersive contacts in the first frequency range.

* * * * *